(12) United States Patent
Masagaki et al.

(10) Patent No.: US 9,083,902 B2
(45) Date of Patent: Jul. 14, 2015

(54) CAMERA SYSTEM AND METHOD OF DRIVING A SOLID-STATE IMAGING APPARATUS

(71) Applicant: Sony Corporation, Tokyo (JP)

(72) Inventors: Atsushi Masagaki, Kanagawa (JP); Takashi Abe, Kanagawa (JP); Ryoji Suzuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 96 days.

(21) Appl. No.: 13/755,857

(22) Filed: Jan. 31, 2013

(65) Prior Publication Data
US 2013/0208162 A1    Aug. 15, 2013

(30) Foreign Application Priority Data

Feb. 14, 2012   (JP) ................................. 2012-029430

(51) Int. Cl.
*H04N 5/359* (2011.01)
*H04N 5/355* (2011.01)
*H04N 5/353* (2011.01)
*H04N 5/3745* (2011.01)
*H01L 27/146* (2006.01)

(52) U.S. Cl.
CPC ............. *H04N 5/3597* (2013.01); *H04N 5/355* (2013.01); *H04N 5/3532* (2013.01); *H01L 27/14609* (2013.01); *H04N 5/3745* (2013.01)

(58) Field of Classification Search
None
See application file for complete search history.

(56) References Cited

U.S. PATENT DOCUMENTS

| | | | |
|---|---|---|---|
| 7,015,964 B1 * | 3/2006 | Koizumi et al. | 348/301 |
| 7,324,144 B1 * | 1/2008 | Koizumi | 348/294 |
| 2006/0237721 A1 * | 10/2006 | Muramatsu et al. | 257/59 |
| 2006/0266923 A1 * | 11/2006 | Mabuchi | 250/208.1 |
| 2008/0012975 A1 * | 1/2008 | Sato et al. | 348/296 |
| 2008/0055439 A1 * | 3/2008 | Mabuchi | 348/296 |
| 2008/0297637 A1 * | 12/2008 | Gomi | 348/296 |
| 2011/0013065 A1 * | 1/2011 | Shinohara | 348/302 |
| 2011/0032403 A1 * | 2/2011 | Mabuchi | 348/296 |
| 2011/0298949 A1 * | 12/2011 | Lee et al. | 348/231.99 |
| 2013/0027596 A1 * | 1/2013 | Wan | 348/302 |
| 2014/0014822 A1 * | 1/2014 | Mabuchi | 250/208.1 |

FOREIGN PATENT DOCUMENTS

| | | |
|---|---|---|
| JP | 2001-045383 | 2/2001 |
| JP | 2006-310932 | 11/2006 |
| JP | 4048415 | 12/2007 |

* cited by examiner

*Primary Examiner* — Justin P Misleh
(74) *Attorney, Agent, or Firm* — Fishman Stewart Yamaguchi PLLC

(57) ABSTRACT

Provided is a method of driving a solid-state imaging apparatus including discharging a signal charge from a photoelectric transducer, by turning on a transfer section and turning on a reset section, at a first timing, in a shutter operation for starting an accumulation of the signal charge for the photoelectric transducer while a selection section is turned off, boosting a floating diffusion section, by turning on the transfer section and turning off the reset section, at a second timing which follows the first timing and taking in an electric signal output to an output signal line by a peripheral circuit section, in a state in which the transfer section is turned on, and generating a pixel signal from the taken in signal.

17 Claims, 9 Drawing Sheets

CAMERA SYSTEM AND METHOD OF DRIVING A SOLID-STATE IMAGING APPARATUS

BACKGROUND

The present disclosure relates to a driving method of a solid-state imaging apparatus and a camera system, which efficiently discharges a signal charge accumulated in a photoelectric transducer having a large capacity.

In related art, a CMOS (Complementary Metal Oxide Semiconductor) image sensor uses a reset transistor for operating a CDS (Correlated Double Sampling) circuit, which removes noise from a pixel signal. Also, a shutter operation is performed which discharges a signal charge accumulated in a photoelectric transducer (for example, a photodiode), which is arranged at an arbitrary position different from that of a readout row (or column, or pixel). In the following description, a CMOS image sensor is abbreviated to CIS (CMOS Image Sensor), and a photodiode is abbreviated to PD (Photo Diode).

Further, a configuration and operation example of a general CIS is disclosed in Japan Patent No. 4048415. Here, a configuration and operation example of a CIS 100 from the related art will be described.

Figure 10:
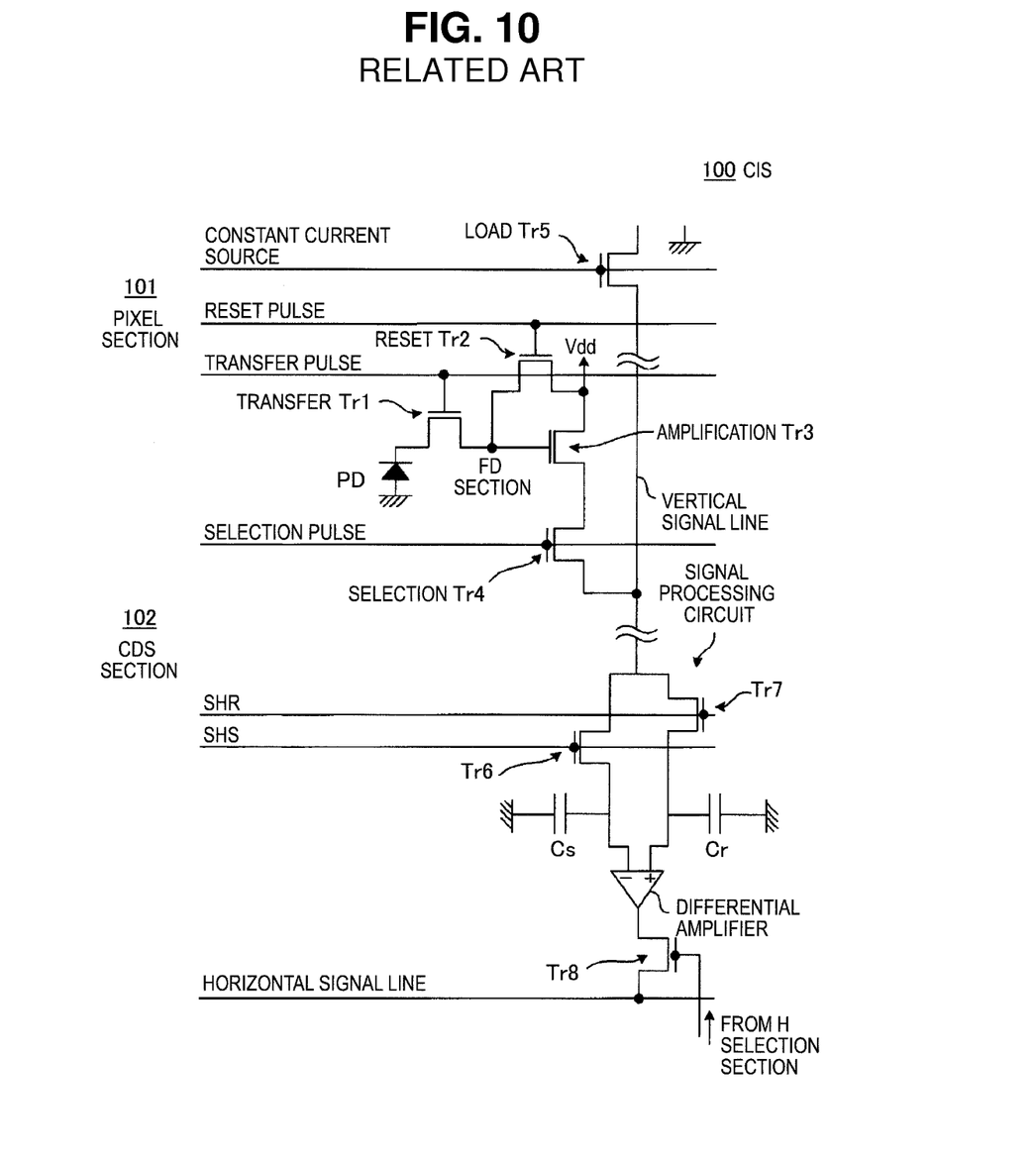
FIG. 10 is a circuit diagram which shows a configuration example of a CIS from the related art.

FIG. 10 is a circuit diagram which shows a configuration example of the CIS 100 from the related art.

The CIS 100 includes a pixel section 101 and a CDS section 102.

The pixel section 101 includes 4 types of MOS transistors (transfer transistor Tr1, reset transistor Tr2, amplification transistor Tr3, and selection transistor Tr4) constituting a PD, which is a photoelectric transducer, and a readout circuit of the PD. Here, a gate which the transfer transistor has is referred to as a transfer gate, and the gates of the other transistors are referred to in a similar way. Further, the pixel section 101 includes a floating diffusion section (hereinafter, a FD (Floating Diffusion) section) which is a floating diffusion region.

The PD generates a signal charge corresponding to the amount of received light, and the transfer transistor Tr1 transfers the signal charge of the PD to the FD section, based on a transfer pulse.

The reset transistor Tr2 regularly resets the voltage of the FD section to the power supply voltage Vdd, based on a gate drive pulse which turns on the reset gate. The voltage value of this Vdd is, for example, 1.8V or 2.7V, and when the pixels increase in size, 5V may also be used.

The amplification transistor Tr3 outputs an output signal corresponding to a voltage fluctuation of the FD section connected to this gate.

The selection transistor Tr4 outputs the output signal of the amplification transistor Tr3 to a vertical signal line, based on a selection pulse which selects the pixel row.

A vertical signal line is arranged in each pixel column, and one end is connected to a load transistor Tr5, which is used as a constant current source outside an imaging region. Further, the other end of the vertical signal line is connected to a signal processing circuit, which is arranged in each pixel column outside the imaging region. This image processing circuit includes the CDS section 102, and outputs an imaging signal by performing various signal processes to the pixel signal arranged in the next stage of the imaging region.

The CDS section 102 includes transistors Tr6 and Tr7 which use SHR and SHS as gate signals, capacitors with electrostatic capacities of Cs and Cr, a differential amplifier which obtains a difference value between the level of the output signals, and a transistor Tr8 arranged between the differential amplifier and a horizontal signal line. This CDS section 102 is a circuit which outputs a signal proportional to the difference between two signals input in a time series.

Here, an operation example of the CIS 100 will be described.

First, the CIS 100 performs a shutter operation which begins the accumulation of a signal charge for an arbitrary row (shutter row, column, or pixel). The pixel section 101, which has become a shutter row, turns on the reset gate and the transfer gate at the same time, and discharges all of the signal charge accumulated in the PD to a power supply drain. The signal charge is discharged, and the PD, which has become empty, starts the accumulation of a signal charge when the transfer gate is turned on again.

Afterwards, when a fixed time has elapsed, a readout operation is performed for an arbitrary line desired to finish the accumulation of the signal charge. The selection gate of the selection transistor is turned on in order to select a signal line which performs a connection to the CDS section 102 at the row (readout row, column, or pixel) to which this readout operation is performed. Afterwards, a signal output when the reset gate is sequentially turned on, and a signal output when the transfer gate is turned on, are both read out by turning on the SHS gate and turning on the SHR gate of the CDS section 102. In this case, when the transistor Tr6 is turned on by a timing signal SHS at the time when the signal charge of the PD is accumulated in the FD section, the capacitor Cs holds the output signal. On the other hand, when the transistor Tr7 is turned on by a timing signal SHR at the time when the FD section is reset, the capacitor Cr holds the output signal of the pixel section 101.

Afterwards, the CDS section 102 treats the signal output when the reset gate is turned on as a noise level, and treats the signal output when the transfer gate is turned on as a noise level which has been superimposed. Also, the level of the output signals held in the two capacitors Cs and Cr are compared by the differential amplifier, the difference between them both is taken, and a difference value is output to the horizontal signal line through the transistor Tr8. In this case, a high quality image is obtained without noise, by excluding the noise level obtained from the difference between the signal output when the reset gate is turned on and the signal output when the transfer gate is turned on.

Further, a structure such as shown in JP 2001-45383A is known as technology related to a shutter operation of the related art, which varies an accumulation period of the signal charge, and reads out an arbitrary part of the pixel region. In addition, an outline of a configuration of a CIS from the related art is disclosed in JP 2006-310932A.

SUMMARY

In recent years, miniaturization of pixels which include a CIS has been promoted by increasing the number of pixels, and improvements have been made in order to achieve low power consumption while raising the resolution. However, since the area of a PD included in miniaturized pixels decreases, the charge amount of a signal charge accumulated by the PD will be reduced compared to that of the related art. Also, when the charge amount accumulated in the PD reduces, a phenomenon is generated such as a decrease in the dynamic range of an image output by the CIS, and becomes a factor in the deterioration of the characteristics of the CIS. Accordingly, deeply setting the potential of the PD in a state where the signal charge becomes empty can be considered for miniaturized pixels as well, in order to easily increase the charge amount which the PD accumulates.

Figure 11:
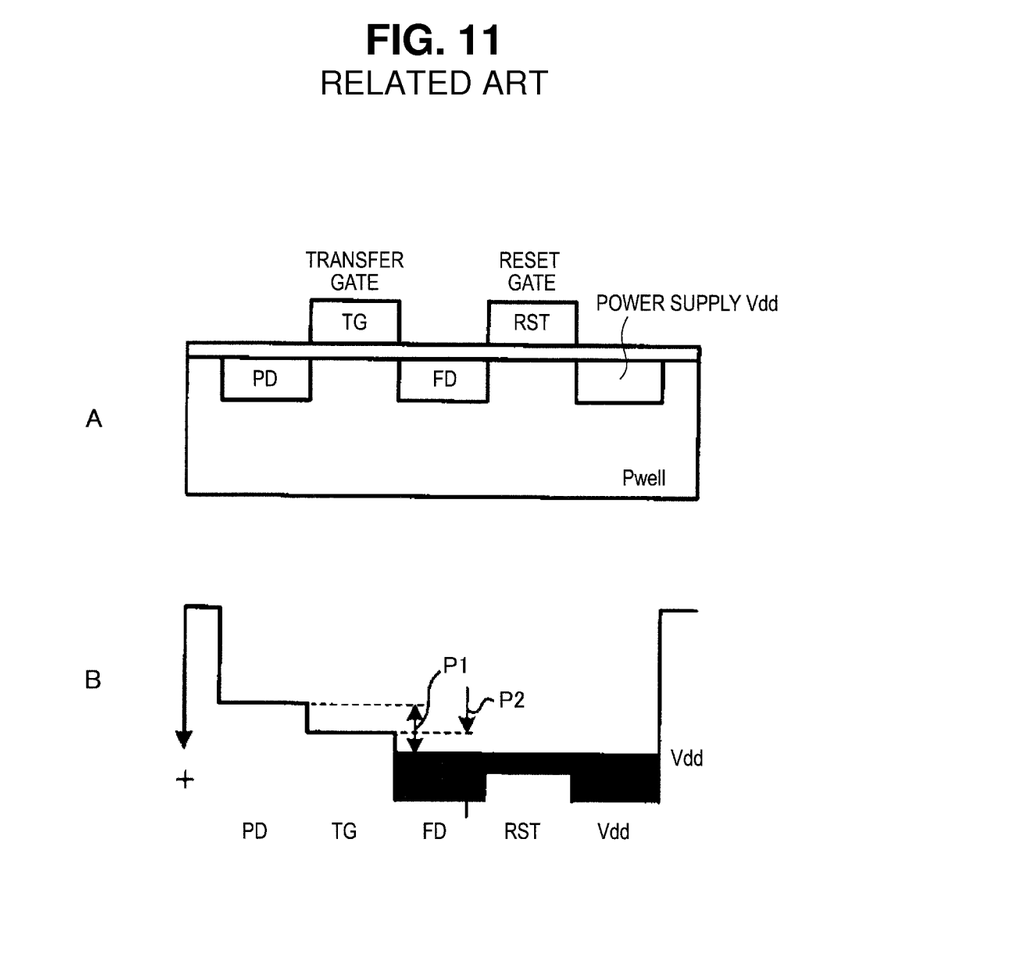
FIG. 11 is an explanatory diagram which shows an example cross section display and an example of a potential of a pixel section from the related art.

FIG. 11 shows a cross section display example of the pixel section 101, and an example of a potential. FIG. 11A shows an example of a PD, transfer gate, FD section, reset gate, and power supply voltage Vdd of the pixel section 101 displayed in a cross section. FIG. 11B shows an example of a potential of the pixel section 101.

When performing an increase in the capacity of a signal charge, which accumulates by deepening the potential of the PD as shown in FIG. 11B, a potential difference P1 between the PD, in which the signal charge is in an empty state, and the FD section will be reduced. Further, when the transfer gate of the pixel section 101 is turned on, a potential difference P2 between the transfer gate and the FD section will also be small. Here, if the transfer gate and the reset gate of the pixel section 101, which has become a shutter row, are turned on at the same time, the electric potential of the FD section will be fixed to a value approaching that of the Vdd (for convenience, this will be "Vdd" in the following description). Here, there is no change in the potential of the FD section, even if a large amount of signal charge accumulated in the PD prior to an accumulation period of the signal charge is transferred to the FD section.

However, when a pixel is further miniaturized, the potential of the PD in the state in which the signal charge is empty will become deep, the potential of the PD will approach that of the Vdd, and it is considered that the signal charge which was not able to be transferred from the PD will remain slightly in the PD. Further, when the transfer gate is turned from on to off, a phenomenon occurs in which the signal charge in the FD section flows back to the PD through the transfer gate, and it may not be possible to discharge the signal charge completely from the PD.

When a video image, which the CIS outputs in a state where the phenomenon of the signal charge flowing back to the PD has occurred, is output to a monitor or the like, there are cases where an afterimage will be generated in the displayed video. Further, there are also cases where a point defect will be generated in the video image, by an offset caused during signal output due to varying the charge amount of the signal charge which has flowed back to the PD. Deepening the potential of the power supply voltage by boosting the reset power supply of the power supply voltage Vdd or the FD section is considered to be a countermeasure against these problems. However, in order to boost the power supply voltage, it may be necessary to raise the resistance performance of an oxide film of the transistors and to increase the wiring incorporated in the CIS, which will increase the number of processes during manufacturing, and this becomes a negative effect of miniaturization.

The present disclosure is performed by considering such a situation, and there is a need for effectively discharging a signal charge accumulated in the PD, even in the case where the PD has a large capacity due to miniaturization of the pixels.

According to an embodiment of the present disclosure, there is provided a method of driving a solid-state imaging apparatus, the solid-state imaging apparatus including an imaging pixel section which includes a plurality of pixels formed on a semiconductor substrate, and a peripheral circuit section which controls the imaging pixel section. Each pixel of the imaging pixel section has a photoelectric transducer which generates a signal charge corresponding to an amount of received light, a transfer gate which transfers the signal charge generated by the photoelectric transducer to a floating diffusion section, an amplification section which outputs an electric signal corresponding to a voltage of the floating diffusion section, which is included in a pixel row selected by a selection section, to an output signal line, and a reset section which rests the voltage of the floating diffusion section. The method of driving the solid-state imaging apparatus includes discharging the signal charge from the photoelectric transducer, by turning on the transfer gate and turning on the reset section, at a first timing, in a shutter operation for starting an accumulation of the signal charge for the photoelectric transducer while the selection section is turned off, boosting the floating diffusion section, by turning on the transfer gate and turning off the reset section, at a second timing which follows the first timing, and taking in the electric signal output to the output signal line by the peripheral circuit section, in a state in which the transfer gate is turned on, and generating a pixel signal from the taken in signal.

According to the embodiment of the present disclosure, an FD section can be boosted, without making the power supply voltage a high voltage, by a coupling capacity generated between the transfer gate and the FD section. Accordingly, in the case where the potential of a photoelectric transducer has been made deep, the signal charge accumulated in the photoelectric transducer can be efficiently discharged to the FD section, and it is possible for the photoelectric transducer to have a large capacity.

DETAILED DESCRIPTION OF THE EMBODIMENT(S)

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Hereinafter, the modes for carrying out the present disclosure (hereinafter, called the embodiments) will be described. Note that the description will be made in the following order.

1. The first embodiment (Discharge control of a signal charge from the PD: Example of performing a discharge operation two times)

2-1. The second embodiment (Discharge control of a signal charge from the PD: Example of performing a discharge operation three times)

2-2. The first modified example of the second embodiment (Example of turning on the third shutter row three or more times)

2-3. The second modified example of the second embodiment (Example of performing a discharge operation two times by all the shutter rows)

3. Application example (Example of applying a solid-state imaging apparatus to a video camera)

4. Modified example

1. The First Embodiment

Example of Performing a Discharge Operation Two Times

Hereinafter, the first embodiment of the present disclosure will be described with reference to FIGS. 1-4. In the present embodiment, an example which is applied to a MOS sensor type solid-state imaging apparatus 10 will be described.

Figure 1:
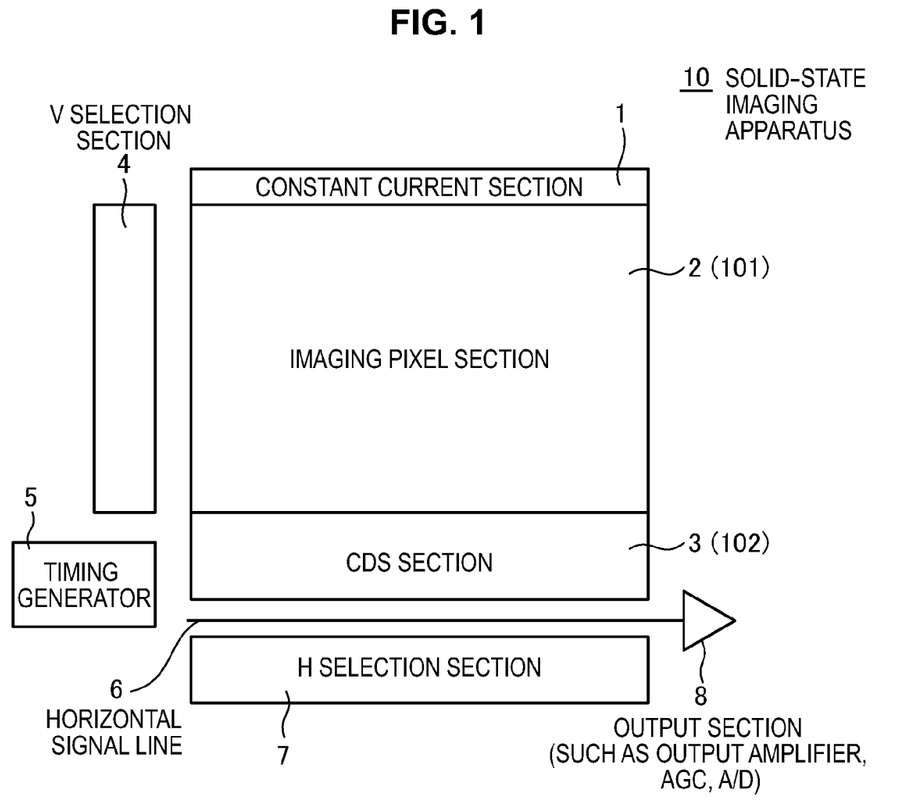
FIG. 1 is a schematic plan view which shows an overall configuration example of a solid-state imaging apparatus in a first embodiment of the present disclosure.

FIG. 1 is a schematic plan view which shows an overall configuration example of the solid-state imaging apparatus 10.

The solid-state imaging apparatus 10 includes an imaging pixel section 2 which has a plurality of pixels formed on a semiconductor substrate not shown in the figure, and a peripheral circuit section which controls the imaging pixel section 2. A constant current section 1, a CDS section 3, a V selection section 4, a timing generator 5, a horizontal signal line 6, an H selection section 7, and an output section 8 are included in the peripheral circuit section.

The constant current section 1 supplies a constant current for each pixel column of the imaging pixel section 2.

The imaging pixel section 2 is configured by the above described CIS 100 shown in FIG. 10, and has multiple pixel sections 101 arranged in a two dimensional matrix. Also, the CIS 100 includes a PD which generates, in each pixel of the imaging pixel section 2, a signal charge corresponding to the amount of received light, and a transfer transistor Tr1 (transfer section) which transfers the signal charge generated by the PD to the FD section. Further, the CIS 100 has an amplification transistor Tr3 (amplification section) which outputs, to an output signal line, an electric signal corresponding to the voltage of the FD section, which is included in a pixel row selected by a selection transistor Tr4 (selection section), and a reset transistor Tr2 (reset section) which resets the voltage of the FD section. Note that the following description will be described by appropriately using the reference numerals shown in FIG. 10.

Further, each pixel of the imaging pixel section 2 is sequentially selected in horizontal line (pixel row) units in a vertical direction by the V selection section 4. Also, each pixel signal is read out to the CDS section 3 for each pixel column through the vertical signal line, by a MOS transistor of each pixel being controlled according to various pulse signals received from the timing generator 5. Note that the timing generator 5 also supplies various timing signals to each of the sections other than each of the pixels of the imaging pixel section 2.

The CDS section 3 includes the above described CDS section 102 shown in FIG. 10 in each pixel column of the imaging pixel section 2, performs a CDS process for the pixel signals read out from each pixel column of the imaging pixel section 2, and outputs pixel signals to the output section 8 through the horizontal signal line 6. In this case, the peripheral circuit section takes in both the signal level, when the signal charge generated by the PD is transferred to the FD section by the transfer gate, and the signal level, when the FD section is reset by the reset section, in a state where the transfer gate is turned on. Then, pixel signals according to this difference of values are output.

The H selection section 7 selects the pixel signals output by the CDS section 3 in a horizontal direction, and outputs these pixel signals to the horizontal signal line 6. Each of the circuits for outputting a video signal by performing processes for the pixel signals input from the CDS section 102, such as Automatic Gain Control (AGC), analogue/digital (A/D) conversion, and amplification, are included in the output section 8.

The output section 8 outputs the pixel signals sent from the horizontal signal line 6 to an external terminal of the semiconductor substrate. Note that while such a configuration itself is basically to the same as that of the related art, the embodiment of the present disclosure includes a driving method which will be hereinafter described.

Figure 2:
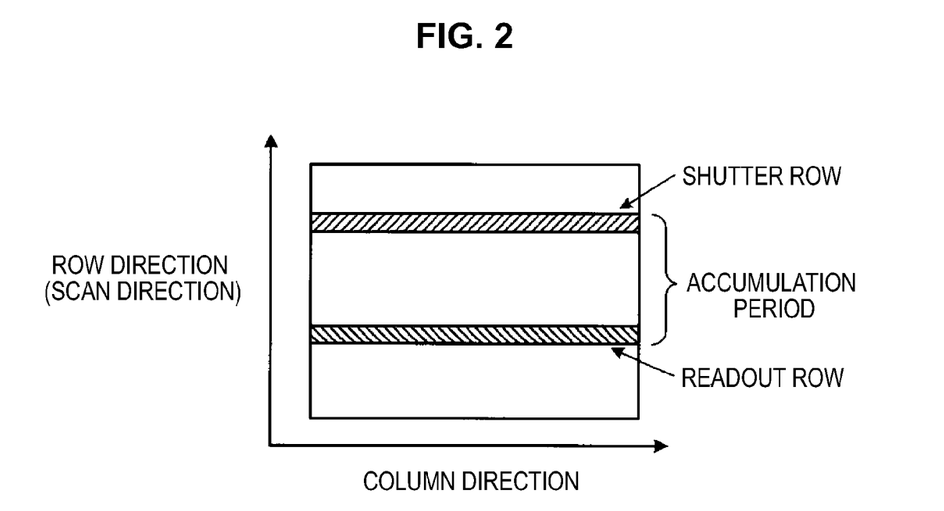
FIG. 2 is an explanatory diagram which shows an example of a shutter row, a readout row and an accumulation period of an imaging pixel section in the first embodiment of the present disclosure.

FIG. 2 is an explanatory diagram which shows an example of a shutter row, a readout row and an accumulation period of the imaging pixel section 2.

The shutter row and the readout row are arranged respectively one by one in the imaging pixel section 2. The signal charge of the PD is reset in the shutter row, and the signal charge is discharged from the PD in the readout row. The shutter row and the readout row move in the scan direction in the figure while a constant interval is emptied. Then, after the shutter row has been set for some row, the period up to where the readout row has been set becomes the accumulation period of the signal charge accumulated in the PD.

The following operation is performed while the selection transistor Tr4 is turned off by the imaging pixel section 2, in the shutter row of the imaging pixel section 2 according to the first embodiment. That is, in a shutter operation for starting the accumulation of a signal charge for the PD, the signal charge is discharged from the PD by turning on the transfer gate and turning on the reset transistor Tr2, at a first timing. Next, the FD section is boosted by turning on the transfer gate and turning off the reset transistor Tr2, at a second timing which follows the first timing. Then, the electric signal output to the output signal line in a state where the transfer gate is turned on is taken in by the peripheral circuit section, and a pixel signal is generated from this taken in signal. Hereinafter, a detailed operation example of the imaging pixel section 2 will be described.

Here, the potential surrounding the PD in the first and second timings will be described with reference to FIGS. 3 and 4.

Figure 3:
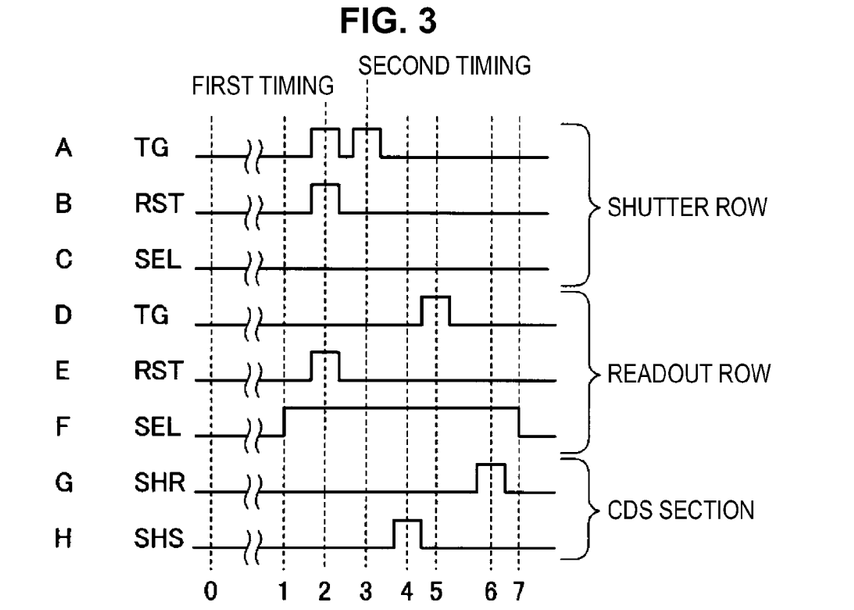
FIG. 3 is a schematic diagram of the drive patterns of the imaging pixel section in the first embodiment of the present disclosure.

FIG. 3 shows a schematic diagram of the drive patterns of the imaging pixel section 2 according to the first embodiment. FIGS. 3A-3C show examples of drive patterns in the shutter row, FIGS. 3D-3F show examples of drive patterns in the readout row, and FIGS. 3G and 3H show examples of drive patterns in the CDS section 3.

Figure 4:
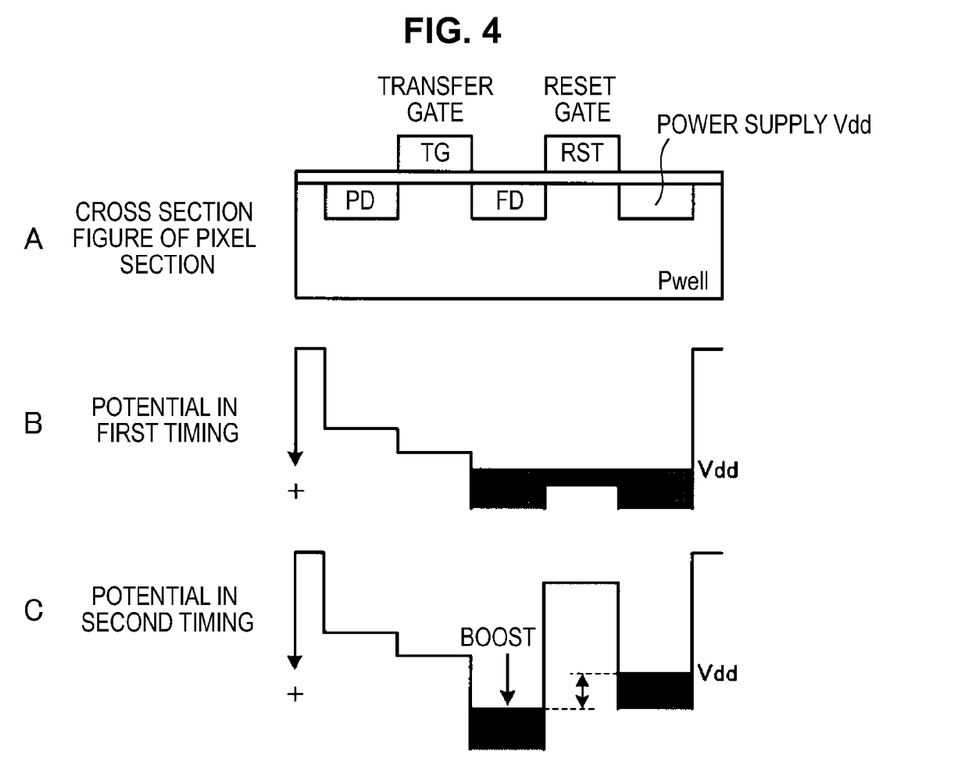
FIG. 4 is an explanatory diagram which shows an example cross section display and an example of a potential of a pixel section in the first embodiment of the present disclosure.

FIG. 4 shows an example cross section display and an example of a potential of the pixel section 101 according to the first embodiment. FIG. 4A shows an example of the PD, transfer gate, FD section, reset gate, and power supply voltage Vdd of the pixel section 101 displayed in a cross section. FIG. 4B shows an example of a potential of the pixel section 101 in a first timing, and FIG. 4C shows an example of a potential of the pixel section 101 in a second timing.

In FIG. 3, the pixel section 101 and the CDS section 102 of the shutter row and the readout row are turned off at a timing 0. Note that the selection transistor Tr4 will continue to be turned off in the shutter row.

Next, when the selection transistor Tr4 of the readout row is turned on at a timing 1, the amplification transistor Tr3 of the pixel section 101 of the readout row is connected to the vertical signal line. Then, a constant current determined by the load transistor Tr5 flows in the route from the Vdd (power supply voltage terminal) to the amplification transistor Tr3, to the vertical signal line, to the load transistor Tr5. Since the amplification transistor Tr3 and the load transistor Tr5 make a source follower, the gate voltage of the amplification transistor Tr3, that is, the voltage corresponding to the voltage of the FD section, will appear in the vertical signal line. This continues while the selection transistor Tr4 of the readout row is turned on.

Next, the reset gates are turned on by a gate drive pulse sent to the reset transistor Tr2 at a timing 2, and the FD sections of the shutter row and the readout row are reset. This timing 2 is called a "first timing". The potential in the first timing changes as shown in FIG. 4B. In this case, the transfer transistor Tr1 in the shutter row is turned on, and both the reset transistor Tr2 in the shutter row and the reset transistor Tr2 in the readout row are turned on.

That is, in the first timing, the transfer gate and the reset gate are turned on at the same time in the shutter row (FIGS. 3A and 3B). In this way, the signal charge of the PD, which is collected before starting the shutter operation, is discharged to the power supply voltage Vdd through the FD section.

Here, as shown in FIG. 4B, the potential of the FD section is fixed to the power supply voltage Vdd, through the reset gate, at the first timing. Accordingly, even if a large amount of the signal charge is collected temporarily in the PD before the shutter operation, a potential difference can be sufficiently secured in which the potential of the FD section becomes shallow at the signal charge from the PD. However, when the signal charge of the PD approaches a state of being empty, and the potential of the PD becomes deep, the potential difference between the PD and the FD section becomes small.

Accordingly, in a timing 3 directly after the timing 2, the transfer transistor Tr1 in the shutter row is turned on again. This timing 3 is called a "second timing". In the second timing, the signal charge from the PD is discharged, by turning on the transfer gate of the transfer transistor Tr1, and turning off the reset gate of the reset transistor Tr2. In this case, the FD section becomes an insulated structure, and is in a floating state in which an electric potential is not fixed. Then, as shown in FIG. 4C, the FD section is set to a potential deeper than the Vdd, by a coupling capacity between the transfer gate and the FD section.

In addition, at the second timing, a voltage corresponding to the electric potential of the FD section (reset level) appears in the vertical signal line. Accordingly, the voltage of a capacitor Cs of the CDS section 102 is held by inputting an SHS pulse in a timing 4.

Next, the signal charge of the PD in the readout row is sent to the FD section, at a timing 5. In this case, the electric potential of the FD section shifts to the negative side in proportion to the signal charge. Then, since the voltage (signal level) corresponding to the electric potential of the FD section appears in the vertical signal line, the voltage of the capacitor Cr of the CDS section 102 is held by inputting an SHR pulse.

A differential amplifier of the CDS section 102 outputs a voltage which is proportional to the difference between the signal level and the reset level held in each of the capacitors Cs and Cr. Afterwards, the selection transistor Tr4 of the readout row is turned off in a timing 7, and the amplification transistor Tr3 is separated from the vertical signal line. Afterwards, the output of the differential amplifier of the CDS section 102 is read out to the horizontal signal line 6, by the control of the transistor Tr8 from the H selection section 7.

The majority of the signal charge collected in the PD, by the operation in the first timing as shown in FIG. 4B, is already discharged, and the PD is almost emptied. However, the signal charge slightly collected in the PD is discharged at the second timing, by deepening the potential of the PD by using the coupling capacity between the transfer gate and the FD section. In this way, a potential difference between the PD and the FD section is secured without an accompanying high voltage for the power supply voltage. Further, the signal charge can be prevented from remaining in the PD, and the signal charge can be prevented from flowing back to the PD when the transfer gate is turned off.

Further, the dispersion of the transfer can be effectively reduced by separating the interval between the transfer of the signal charge in the first timing (transfer gate on, reset gate on) and the transfer of the signal charge in the second timing (transfer gate on, reset gate off) to 1μ second or more. While this interval which is made 1μ second is an empirical value, a length which may be necessary for stabilizing an interface order of the transfer gates can be confirmed by experiment.

Such an emptying of the interval between the first and second timings depends on the following reasons. That is, when transferring the signal charge in the first timing, there are cases where the potential difference between the PD and the FD section is not sufficiently secured, and the effect of boosting the voltage of the FD section by the coupling capacity is not able to be obtained. In this case, the signal charge entered under the transfer gate is trapped by an interface level, and a sufficient potential difference between the PD and the PD section is secured by setting the second timing, in order to suppress the influence of the dispersion caused by discharging.

With the imaging pixel section 2 according to the above described first embodiment, a two stage discharge process is performed, in the case where the signal charge is discharged by fixing the Vdd without using the coupling capacity, and in the case where the signal charge, which is not able to be transferred from the PD by the change of the FD section, is discharged by using the coupling capacity. Here, a large amount of the signal charge is discharged beforehand at the first timing, in order for the electric potential of the FD section to change in the case where there is a large amount of the signal charge in the PD before performing the shutter operation, and thereafter the shutter is driven at the second timing. In this case, the FD section is maintained in a floating state, and the shutter is driven so as to boost the electric potential of the FD section by using the coupling capacity between the transfer gate and the FD section. Accordingly, a sufficient potential difference is generated between the PD and the FD section, and the slight signal charge accumulated in the PD is also discharged to the FD section.

Further, it is possible for the PD to have a large capacity for accumulating a large amount of the signal charge, even for a miniaturized pixel section 101, since the PD can secure a sufficient potential. Deficiencies, such as drawing up the signal charge from the FD section to the PD during the shutter operation, and not being able to transfer the signal charge accumulated in the PD to the FD section, can be improved.

Further, it becomes possible to boost the potential of the FD section without increasing the power supply voltage, for making a larger capacity for the PD involving miniaturization, by performing a boost of the FD section which uses the coupling capacity of the transfer gate and the FD section.

2-1. The Second Embodiment

Example of Performing a Discharge Operation Three Times

Next, the second embodiment of the present disclosure will be described with reference to FIGS. 5 and 6. In the present embodiment, an example will be described in which a signal charge is discharged from the PD by controlling the timing which turns on the transfer gate in a plurality of adjoining shutter rows. In the following description, the same reference numerals are attached to parts corresponding to those of FIG. 1 already described above by the first embodiment, and a detailed description of these parts will be omitted.

In the case where a signal charge is discharged from the PD by using a plurality of consecutive shutter rows, the imaging pixel section 2 according to the second embodiment has a timing which turns on the transfer gate of at least the final row which is different to the timing for the shutter rows other than the final row. In this case, the transfer gate is turned on and the reset transistor Tr2 is turned on for the shutter rows other than the final row, and the transfer gate is turned off and the reset transistor Tr2 is turned on for the final shutter row, at the first timing. Then, the signal charge is discharged from the PD of each of the shutter rows, by turning off the transfer gate and turning off the reset transistor Tr2 for the shutter rows other than the final row, and turning on the transfer gate and turning off the reset transistor Tr2 for the final shutter row, at the second timing. A detailed operation example of the imaging pixel section 2 for this case will be described with reference to FIGS. 5 and 6.

Figure 5:
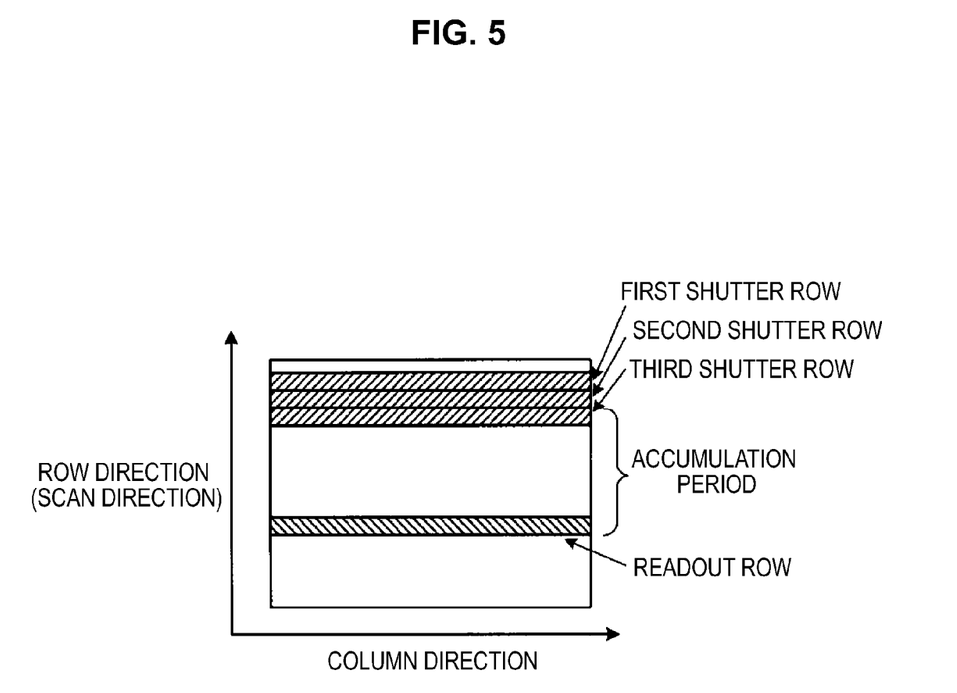
FIG. 5 is an explanatory diagram which shows an example of a shutter row and a readout row of the imaging pixel section in a second embodiment of the present disclosure.

FIG. 5 is an explanatory diagram which shows an example of the shutter rows and the readout row of the imaging pixel section 2.

The imaging pixel section 2 sets consecutive first to third shutter rows, a row which becomes the accumulation period, and a readout row. The third shutter row and the readout row move in the scan direction while a constant interval is emptied. Also, the period after the third shutter row and up to when the readout row is input becomes the accumulation period of the signal charge.

Figure 6:
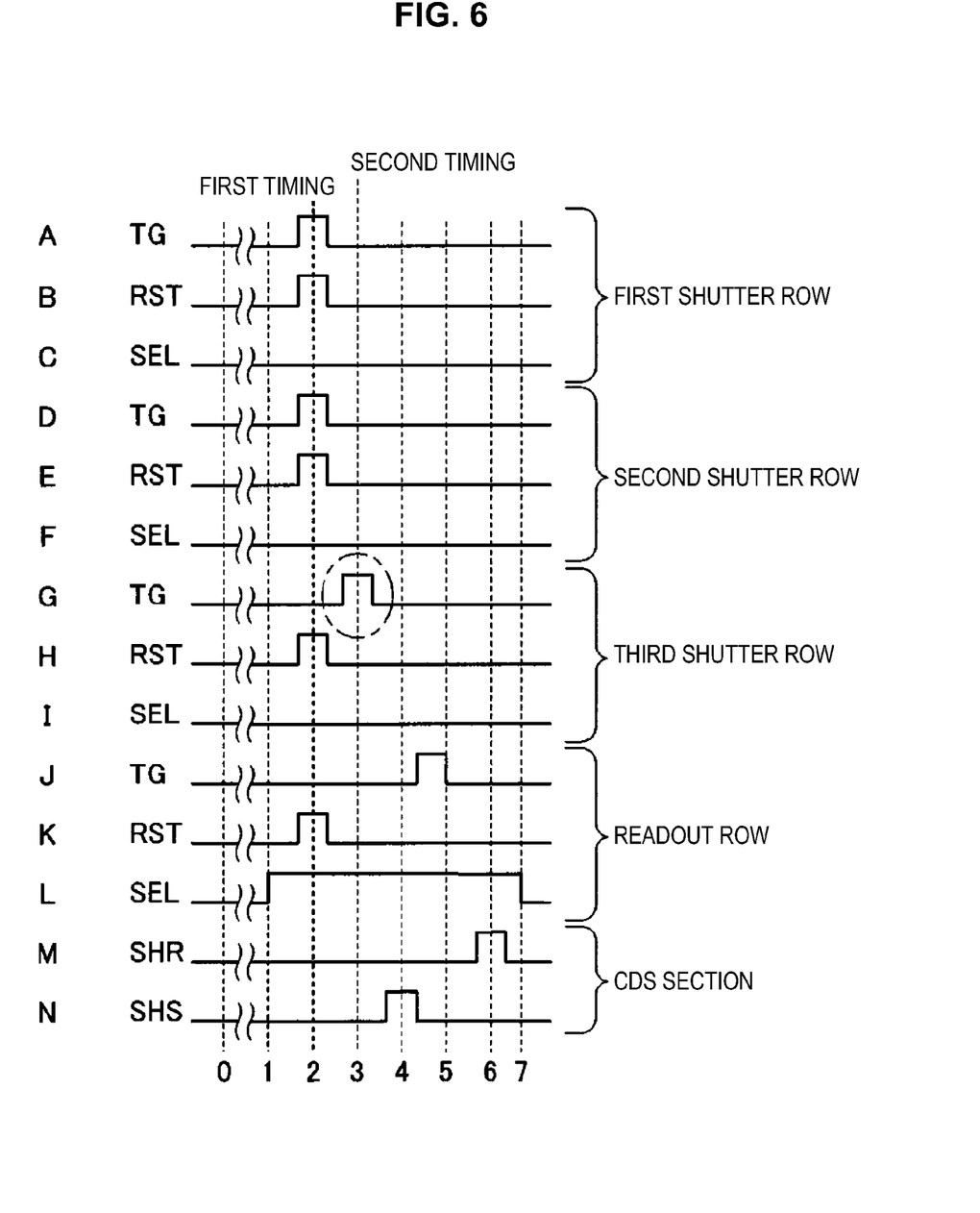
FIG. 6 is a schematic diagram of the drive patterns of the imaging pixel section in the second embodiment of the present disclosure.

FIG. 6 shows a schematic diagram of the drive patterns of the imaging pixel section 2 according to the second embodiment. FIGS. 6A-6C show examples of drive patterns in the first shutter row, FIGS. 6D-6F show examples of drive patterns in the second shutter row, and FIGS. 6G-6I show examples of drive patterns in the third shutter row. Also, FIGS. 6J-6L show examples of drive patterns in the readout row, and FIGS. 6M and 6N show examples of drive patterns in the CDS section 102.

As shown in FIG. 5, three consecutive shutter rows are set as an example in the imaging pixel section 2. Here, as described in Japan Patent No. 4243870, the discharge of unnecessary signal charges is performed in a group unit before the accumulation of the signal charge, by making two or more adjacent columns one group in the imaging pixel section 2, and the signal charges are further discharged in the group unit. This solid-state imaging apparatus performs a discharge of unnecessary charges accumulated in the pixels, before the readout timing of the previous group, by applying a pre-shutter pulse to the pixels, which belong to 1 row or column adjacent to at least the previous group, in the next group.

However, when a large amount of the signal charge is accumulated in the PD when starting the shutter operation, there are cases where the potential of the FD section changes as the signal charge of the PD is transferred, and a potential difference between the PD and the FD section may not be able to be sufficiently secured. Accordingly, the imaging pixel section 2 according to the second embodiment performs the following operation.

That is, in the first timing shown in the timing 2, the transfer gates from the first shutter row, which is the initial shutter row, to the second shutter row, which is the row just before the final shutter row, are turned on, and the signal charge of the PD is discharged in a state where the reset gates are turned on. In this case, a large amount of the signal charge accumulated in the PD is discharged by maintaining the state in which the third shutter row, which is the final shutter row, turns on only the reset gate.

Afterwards, when the signal charge is discharged from the PD to the FD section by the shutter operation, the reset gates are turned off, and the period in which the transfer gate is turned on is set. Accordingly, in the second timing shown in the timing 3, the transfer gate of the final shutter row, which starts the final accumulation of the signal charge, is turned on, and the signal charge from the PD is discharged in a state in which the reset gates are turned off. In this way, almost all the signal charge can be discharged from the PD in the same way as that of the above described first embodiment. In this case, it is possible to have the FD sections of the shutter rows in a floating state, and to boost the FD section to a potential deeper than the Vdd, by the coupling capacity between the transfer gate and the FD section.

With the imaging pixel section 2 in the above described second embodiment, the consecutive shutter rows 1-3 are set. Then, at the first timing, the transfer gates from the initial shutter row to the second shutter row, which is the row just before the final shutter row, are turned on, and the signal charge of the PD is discharged in a state where the reset gates are turned on. Afterwards, at the second timing, the transfer gate in the third shutter row is turned on, and the transfer gates of the other shutter rows and the reset gates are turned off. In this way, the signal charge accumulated in the PD can be surely discharged, by controlling the turning on or off of the transfer gates of the plurality of shutter rows. Also, a potential difference between the PD and the FD section can be secured during the shutter operation without an accompanying high voltage for the power supply voltage.

2-2. First Modified Example of the Second Embodiment

Example of Turning on the Third Shutter Row Three Times or More

Note that in the imaging pixel section 2 in the above described second embodiment, while the transfer gate of the third shutter row is turned on in the second timing, the transfer gate of the third shutter row may be turned on in a third timing which follows the second timing.

Accordingly, in the imaging pixel section 2 according to the first modified example of the second embodiment, the transfer gates are turned on and the reset transistors Tr2 are turned on for the plurality of shutter rows, at the first timing. Next, the transfer gates are turned off and the reset transistors Tr2 are turned off for the shutter rows other than the final row, and the transfer gate is turned on and the reset transistor Tr2 is turned off for the final shutter row, at the second timing. Then, the signal charge is discharged from the PD of each of the shutter rows, by turning on the transfer gates at least once and turning off the reset transistors Tr2, at a timing which follows the second timing. Detailed drive patterns of the imaging pixel section 2 for this case will be described with reference to FIG. 7.

Figure 7:
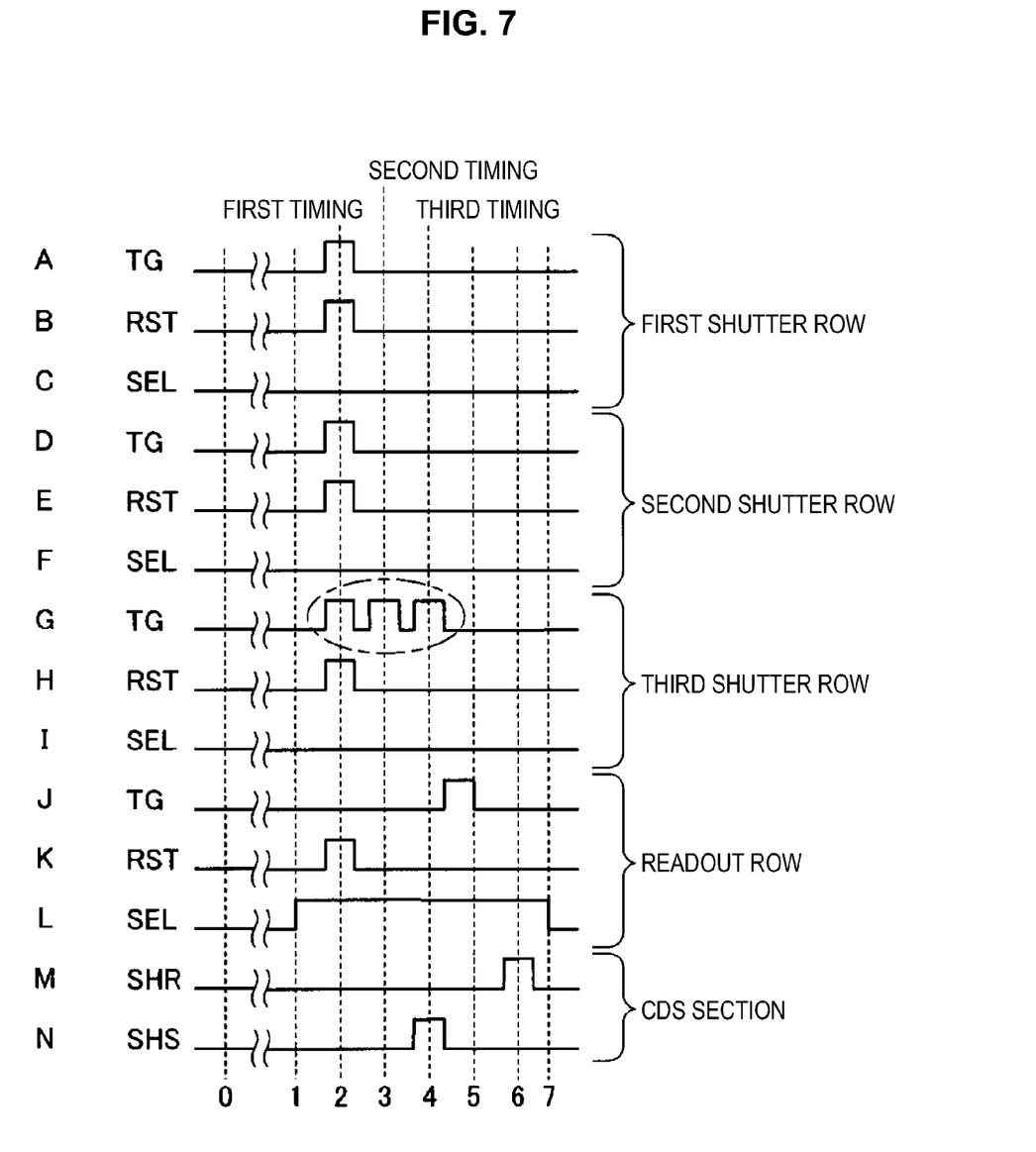
FIG. 7 is a schematic diagram of the drive patterns of the imaging pixel section in a first modified example of the second embodiment of the present disclosure.

FIG. 7 shows a schematic diagram of the drive patterns of the imaging pixel section 2.

While the drive patterns of the imaging pixel section 2 shown in FIG. 7 are almost the same as the above described drive patterns shown in FIG. 6, the timing is different for turning the transfer gate on in the third shutter row, which is used as the final row. Here, the transfer gate in the third shutter row is turned on in the newly set third timing, in addition to the first and the second timings. During the second and third timings, the transfer transistor Tr1 in the other shutter rows, the reset transistors Tr2, and the selection transistors Tr4 are all turned off. In this way, it is possible for the signal charge accumulated in the PD to be surely discharged, by turning on the transfer gates three times in succession in the third shutter row.

2-3. Second Modified Example of the Second Embodiment

Example of Performing a Discharge Operation Two Times in all Shutter Rows

Further, in the imaging pixel section 2 in the above described second embodiment, while only the transfer gate of the third shutter row is turned on in the second timing, the transfer gates of the first to third shutter rows may be turned on in succession at the first and second timings.

Accordingly, in the imaging pixel section 2 according to the second modified example of the second embodiment, the transfer gates are turned on and the reset transistors Tr2 are turned on for all the shutter rows, at the first timing. Next, the signal charge is discharged from the PD of each of the shutter rows, by turning on the transfer gates and turning off the reset transistors Tr2 for all the shutter rows, at the second timing. Detailed drive patterns of the imaging pixel section 2 for this case will be described with reference to FIG. 8.

Figure 8:
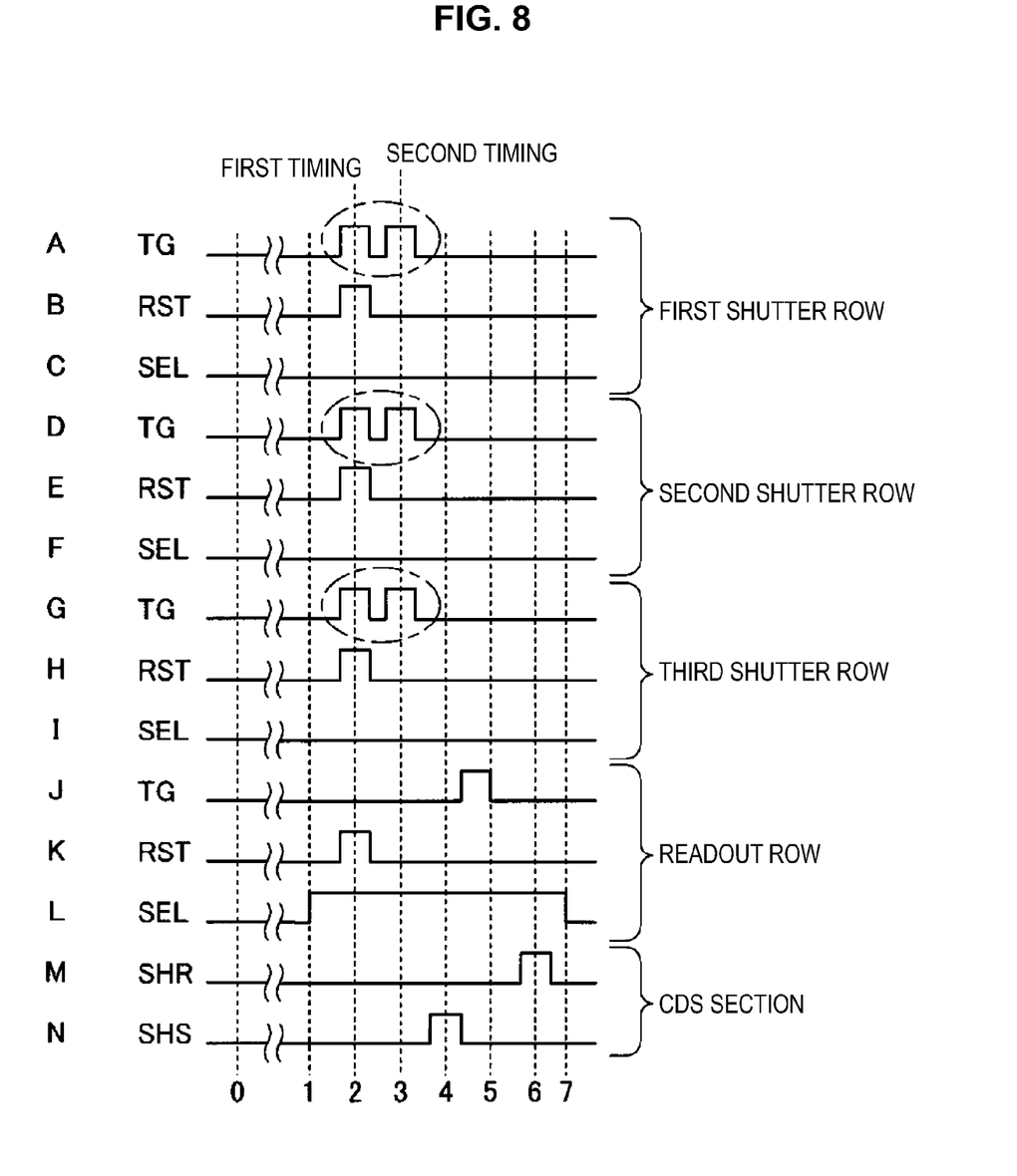
FIG. 8 is a schematic diagram of the drive patterns of the imaging pixel section in a second modified example of the second embodiment of the present disclosure.

FIG. 8 shows a schematic diagram of a drive pattern of the imaging pixel section 2.

While the drive patterns of the imaging pixel section 2 shown in FIG. 8 are almost the same as the above described drive patterns shown in FIG. 6, there is a point of difference in which the transfer gates are turned on in all the shutter rows (first to third shutter rows) in the second timing, which follows the first timing. In this case, a two stage discharge process is performed in the first to third shutter rows, in the case where the signal charge is discharged by fixing the Vdd without using the coupling capacity, and in the case where the signal charge, which is not able to be transferred from the PD by the change of the FD section, is discharged by using the coupling capacity. Accordingly, a sufficient potential difference is generated between the PD and the FD section, and the slight signal charge accumulated in the PD is also discharged to the FD section. Accordingly, in the first and the second timings, it is possible to surely discharge the signal charge accumulated in the PD, by turning on the transfer gates two times in succession in the first to third shutter rows.

Application Example

Example of Applying a Solid-State Imaging Apparatus to a Video Camera

A solid-state imaging apparatus, to which a Cu—Cu bonding technique is applied for the various embodiments and modified examples described above, can be applied to an electronic apparatus, such as a camera system of a digital camera, a video camera or the like, a mobile phone which has an imaging function, or another apparatus which includes an imaging function. In this application example, a camera system for example will be described as an example configuration of the electronic apparatus.

Figure 9:
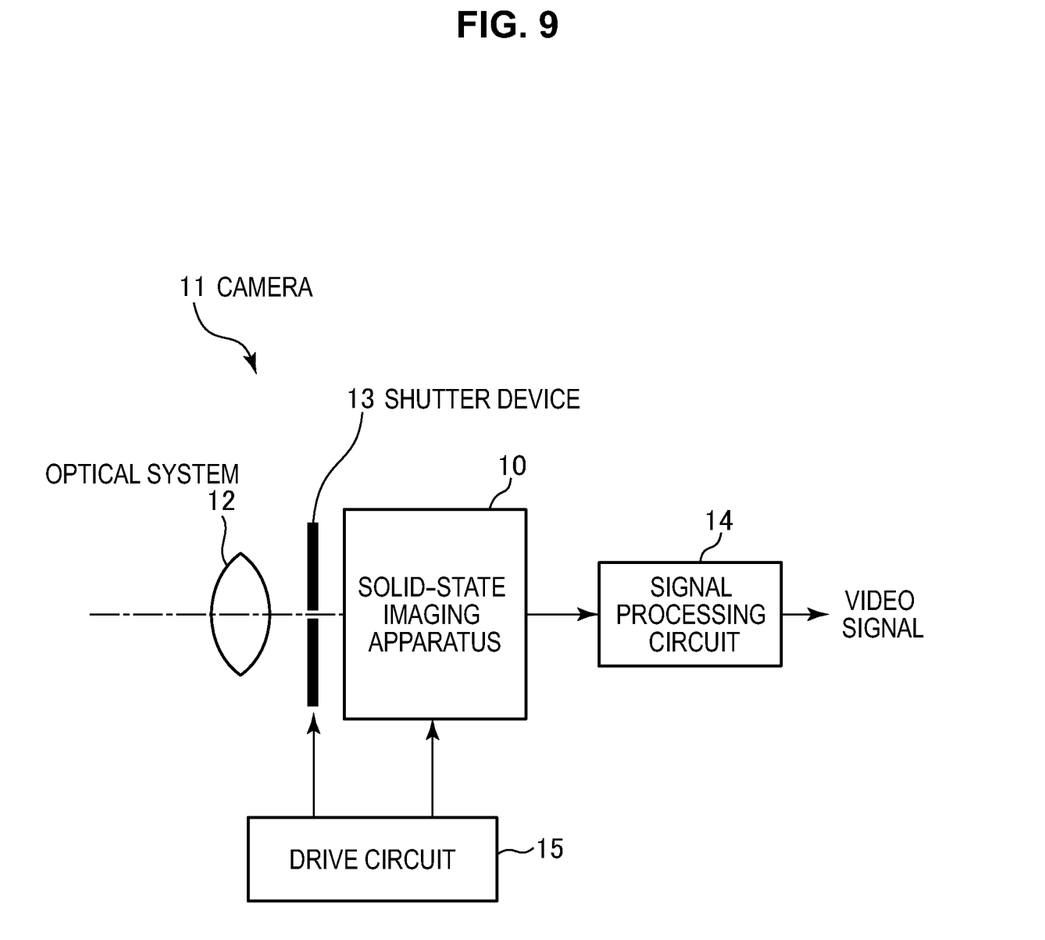
FIG. 9 is a block diagram which shows an internal configuration example of a video camera in a modified example of the first and second embodiments of the present disclosure.

FIG. 9 shows a schematic configuration of a camera 11 according to the application example. Note that the camera 11 shown in FIG. 9 is a configuration example of a video camera which can photograph a still image or a moving image.

The camera 11 includes a solid-state imaging apparatus 10, an optical system 12 which includes an optical lens guiding incident light to a light receiving sensor section of the solid-state imaging apparatus 10, a shutter device 13 arranged between the solid-state imaging apparatus 10 and the optical system 12, and a drive circuit 15 which drives the solid-state imaging apparatus 10. In addition, the camera 11 includes a signal processing circuit 14 which processes an output signal of the solid-state imaging apparatus 10.

The solid-state imaging apparatus 10 is fabricated by using a Cu—Cu bonding technique. The configuration and function of each of the other sections are as follows.

The optical system 12 forms image light (incident light) from a photographic subject onto an imaging surface (not shown in the figure) of the solid-state imaging apparatus 10. In this way, a signal charge is accumulated, for a fixed period, in the solid-state imaging apparatus 10. Note that the optical system 12 may be configured by an optical lens group which includes a plurality of optical lenses. Further, the shutter device 13 controls a light irradiation period and a light shielding period for the incident light of the solid-state imaging apparatus 10.

The drive circuit 15 supplies a drive signal to the solid-state imaging apparatus 10 and the shutter device 13. Also, the drive circuit 15 controls a signal output operation to the signal processing circuit 14 of the solid-state imaging apparatus 10, and a shutter operation of the shutter device 13, according to the supplied drive signal. That is, in this example, a signal transfer operation is performed from the solid-state imaging apparatus 10 to the signal processing circuit 14, according to the drive signal (timing signal) supplied from the drive circuit 15. The drive circuit 15 during the shutter operation performs a process which controls the turning on or off of the transfer gates and the reset gates, for the solid-state imaging apparatus 10 according to the above described first and second embodiments, and the first modified example of the second embodiment.

The signal processing circuit 14 applies various signal processes to the signal transferred from the solid-state imaging apparatus 10. Also, the signal (video signal) to which the various signal processes have been applied is stored in a storage medium such as a memory (not shown in the figure), or is output to a monitor (not shown in the figure).

4. Modified Example

Note that the above described first and second modified examples of the second embodiment controlled the shutter operation for the three consecutive rows of the first to third shutter rows. However, the shutter operation may be controlled by either two consecutive shutter rows or more than three consecutive shutter rows. Further, it is possible to not only set a timing of two or three consecutive times, but to also set a timing of four or more times. This is also the same in the setting of the timing in the first embodiment. Further, the above described driving method of the solid-state imaging apparatus may be applied to a CCD imager, and the circuit configuration of a CMOS sensor may be applied to the circuit configuration of the CCD imager.

Further, in the above described embodiments, while the transistors of the pixel section 101 are as assumed to be NMOS, they are also the same as PMOS, even if the polarity of the voltage is switched. Further, the photoelectric transducer may not be a photodiode, and may be a photogate, for example.

Further, in the above described embodiments, while the voltage is output from the pixels in the vertical signal line, the output signal line may be a line in the horizontal direction, and the output signal may be a current signal. Further, a system which is configured by four transistors, such as described above, is not limited to a pixel structure.

Further, while the CDS circuit is an example of a signal processing circuit at the next stage, it may be an A/D converter, for example, having the effect of a CDS. Further, it is possible for the CDS to adopt a configuration so as to be placed in a further subsequent stage, as a circuit simply keeping the reset level and the signal level.

In this way, the present disclosure is not limited to the above described embodiments, and needless to say that other various application examples and modified examples may be provided as long as they do not deviate from the contents of the above described present disclosure.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

(1) A method of driving a solid-state imaging apparatus, the solid-state imaging apparatus including
  an imaging pixel section which includes a plurality of pixels formed on a semiconductor substrate, and
  a peripheral circuit section which controls the imaging pixel section,
    wherein each pixel of the imaging pixel section has
    a photoelectric transducer which generates a signal charge corresponding to an amount of received light,
    a transfer section which transfers the signal charge generated by the photoelectric transducer to a floating diffusion section,
    an amplification section which outputs an electric signal corresponding to a voltage of the floating diffusion section, which is included in a pixel row selected by a selection section, to an output signal line, and
    a reset section which rests the voltage of the floating diffusion section,
  the method of driving the solid-state imaging apparatus including:
    discharging the signal charge from the photoelectric transducer, by turning on the transfer section and turning on the reset section, at a first timing, in a shutter operation for starting an accumulation of the signal charge for the photoelectric transducer while the selection section is turned off;
    boosting the floating diffusion section, by turning on the transfer section and turning off the reset section, at a second timing which follows the first timing; and
    taking in the electric signal output to the output signal line by the peripheral circuit section, in a state in which the transfer section is turned on, and generating a pixel signal from the taken in signal.

(2) The method of driving the solid-state imaging apparatus according to (1),
  wherein, when the signal charge is discharged from the photoelectric transducer by using a plurality of continuous shutter rows, a timing at which the transfer section of at least a final row is turned on is different from a timing for the shutter rows other than the final row.

(3) The method of driving the solid-state imaging apparatus according to (1) or (2), the method further including:
    turning on the transfer sections and turning on the reset sections for the shutter rows other than the final row, and turning off the transfer section and turning on the reset section for the final shutter row, at the first timing; and
    discharging the signal charge from the photoelectric transducer of each of the shutter rows, by turning off the transfer sections and turning off the reset sections for the shutter rows other than the final row, and turning on the transfer section and turning off the reset section for the final shutter row, at the second timing.

(4) The method of driving the solid-state imaging apparatus according to any one of (1) to (3), the method further including:
    turning on the transfer sections and turning on the reset sections for the plurality of shutter rows, at the first timing;
    turning off the transfer sections and turning off the reset sections for the shutter rows other than the final row, and turning on the transfer section and turning off the reset section for the final shutter row, at the second timing; and
    discharging the signal charge from the photoelectric transducer of each of the shutter rows, by turning on the transfer sections at least one time and turning off the reset sections, at a timing which follows the second timing.

(5) The method of driving the solid-state imaging apparatus according to any one of (1) to (3), the method further including:
    turning on the transfer sections and turning on the reset sections for all the shutter rows, at the first timing, and
    turning on the transfer sections and turning on the reset sections for all the shutter rows, at the second timing.

(6) The method of driving the solid-state imaging apparatus according to any one of (1) to (5),
  wherein an interval between the first and the second timings is 1 n second or more.

(7) A camera system including:
  a solid-state imaging apparatus including
    an imaging pixel section which includes a plurality of pixels formed on a semiconductor substrate, and
    a peripheral circuit section which controls the imaging pixel section,
      wherein each pixel of the imaging pixel section has
      a photoelectric transducer which generates a signal charge corresponding to an amount of received light,
      a transfer section which transfers the signal charge generated by the photoelectric transducer to a floating diffusion section,
      an amplification section which outputs an electric signal corresponding to a voltage of the floating diffusion section, which is included in a pixel row selected by a selection section, to an output signal line, and a reset section which rests the voltage of the floating diffusion section; and a drive circuit which discharges the signal charge from the photoelectric transducer, by turning on the transfer section and turning on the reset section, at a first timing, in a shutter operation for starting an accumulation of the signal charge for the photoelectric transducer while the selection section is turned off, and which boosts the floating diffusion section, by turning on the transfer section and turning off the reset section, at a second timing which follows the first timing, wherein the solid-state imaging apparatus takes in the electric signal output to the output signal line by the peripheral circuit section, in a state in which the transfer section is turned on, and generates a pixel signal from the taken in signal.

The present disclosure contains subject matter related to that disclosed in Japanese Priority Patent Application JP 2012-029430 filed in the Japan Patent Office on Feb. 14, 2012, the entire content of which is hereby incorporated by reference.

What is claimed is:

1. A method of driving a solid-state imaging apparatus, the method comprising:
   a step (1) of electrically disconnecting a vertical signal line in an imaging pixel section from an amplification transistor in a first shutter row pixel by turning off a selection transistor in the first shutter row pixel;
   a step (2) of electrically connecting the vertical signal line to an amplification transistor in a readout row pixel by turning on a selection transistor in the readout row pixel, the step (1) commencing before the step (2) and the step (2) occurring during the step (1);
   a step (3) of electrically connecting a power supply voltage to a floating diffusion section in the readout row pixel by turning on a reset transistor in the readout row pixel, the step (2) commencing before the step (3) and the step (3) occurring during the step (2);
   a step (4) of electrically connecting the power supply voltage to a floating diffusion section in the first shutter row pixel by turning on a reset transistor in the first shutter row pixel, the step (3) occurring during the step (4) and the step (4) occurring during the step (2);
   a step (5) of electrically connecting a photoelectric transducer in the first shutter row pixel to the floating diffusion section in the first shutter row pixel by turning on a transfer transistor in the first shutter row pixel, the step (5) occurring during the step (4);
   a step (a) of electrically disconnecting the vertical signal line from an amplification transistor in a second shutter row pixel by turning off a selection transistor in the second shutter row pixel;
   a step (b) of electrically connecting the power supply voltage to a floating diffusion section in the second shutter row pixel by turning on a reset transistor in the second shutter row pixel, the step (b) occurring during the step (a) and the step (1) occurring during the step (a); and
   a step (c) of electrically connecting a photoelectric transducer in the second shutter row pixel to the floating diffusion section in the second shutter row pixel by turning on a transfer transistor in the second shutter row pixel, the step (4) occurring before the step (c),
   wherein the first shutter row pixel is a pixel in a first shutter row and the readout row pixel is a pixel in a readout row, the readout row being a row in the imaging pixel section and the first shutter row being another row in the imaging pixel section,
   wherein the second shutter row pixel is a pixel in a second shutter row, the second shutter row being in the imaging pixel section between the first shutter row and the readout row.

2. The method of claim 1, wherein the step (5) occurs during the step (2).

3. The method of claim 1, wherein the step (4) occurs before the step (5).

4. The method of claim 1, further comprising:
   a step of generating a signal charge corresponding to an amount of light received by the photoelectric transducer in the first shutter row pixel.

5. The method of claim 1, further comprising:
   a step (6) of electrically connecting a photoelectric transducer in the readout row pixel to the floating diffusion section in the readout row pixel by turning on a transfer transistor in the readout row pixel, the step (5) occurring before the step (6).

6. The method of claim 5, further comprising:
   a step of generating a signal charge corresponding to an amount of light received by the photoelectric transducer in the readout row pixel.

7. The method of claim 1, wherein the step (c) occurs during the step (2).

8. The method of claim 1, wherein the step (c) occurs during the step (4).

9. The method of claim 1, further comprising:
   a step of generating a signal charge corresponding to an amount of light received by the photoelectric transducer in the second shutter row pixel.

10. The method of claim 1, wherein a third shutter row in the imaging pixel section is between the second shutter row and the readout row, the method further comprising:
    a step (i) of electrically disconnecting the vertical signal line from an amplification transistor in a third shutter row pixel by turning off a selection transistor in the third shutter row pixel, the third shutter row pixel being a pixel in the third shutter row.

11. The method of claim 10, wherein the step (i) occurs during the step (1).

12. The method of claim 10, further comprising:
    a step (ii) of electrically connecting the power supply voltage to a floating diffusion section in the third shutter row pixel by turning on a reset transistor in the third shutter row pixel, the step (ii) occurring during the step (i).

13. The method of claim 12, further comprising:
    a step (iii) of electrically connecting a photoelectric transducer in the third shutter row pixel to the floating diffusion section in the third shutter row pixel by turning on a transfer transistor in the third shutter row pixel.

14. The method of claim 13, wherein the step (iii) occurs during the step (2).

15. The method of claim 13, wherein the step (iii) occurs during the step (4).

16. The method of claim 13, wherein the step (4) occurs before the step (iii).

17. The method of claim 13, further comprising:
    a step of generating a signal charge corresponding to an amount of light received by the photoelectric transducer in the third shutter row pixel.

* * * * *